United States Patent [19]

Fröling et al.

[11] Patent Number: 4,701,794

[45] Date of Patent: Oct. 20, 1987

[54] TELEVISION RECEIVER COMPRISING A TELETEXT DECODING CIRCUIT AND A PAGE NUMBER MEMORY

[75] Inventors: Melchert H. Fröling; Herman J. R. Schmitz, both of Eindhoven, Netherlands

[73] Assignee: U.S. Philips Corporation, New York, N.Y.

[21] Appl. No.: 722,636

[22] Filed: Apr. 12, 1985

[30] Foreign Application Priority Data

Jan. 9, 1985 [NL] Netherlands ............... 8500047

[51] Int. Cl.$^4$ .................................. H04N 7/04
[52] U.S. Cl. .................... 358/147; 358/141; 358/146
[58] Field of Search ............. 358/12, 141, 142, 146, 358/147

[56] References Cited

U.S. PATENT DOCUMENTS

| | | | |
|---|---|---|---|
| 4,099,258 | 7/1978 | Parsons | 358/147 |
| 4,161,728 | 7/1979 | Insam | 358/147 |
| 4,611,227 | 9/1986 | Brockhurst et al. | 358/147 |

OTHER PUBLICATIONS

"Enhanced UK Teletext Moves Towards Still Pictures"; John P. Chambers; IEEE Transactions on Consumer Electronics; vol. CE-26; pp. 527–532, Aug. 1980.
"Computer Controlled Teletext"; J. R. Kinghorn; Electronic Components and Applications; vol. 6, No. 1; 1984; pp. 15–29.

Primary Examiner—Howard W. Britton
Assistant Examiner—John K. Peng
Attorney, Agent, or Firm—Thomas A. Briody; William J. Streeter; Gregory P. Gadson

[57] ABSTRACT

A television receiver which is suitable for displaying teletext pages comprises a control system including a microcomputer. The microcomputer is coupled to a volatile memory which comprises a plurality of page number registers. A page number can be temporarily stored in each of these registers. With the aid of a keyboard the user makes known which page numbers he wants to have stored in the different registers and the stored page numbers represent a first series of pages. One single read key (RCL) is provided for the display of such a page. Each time this key is depressed once, a different page belonging to the first series appears on the picture screen. The sequence in which the pages appear is the same as the sequence in which the user has keyed-in the relevant page numbers. This sequence can be interrupted by the occurrence of a preselected operating instruction in response to which a number of teletext pages not associated with said first series can be displayed on the picture screen. Thereafter, the display of the teletext pages of the first series can be continued.

2 Claims, 10 Drawing Figures

TELEVISION RECEIVER COMPRISING A TELETEXT DECODING CIRCUIT AND A PAGE NUMBER MEMORY

BACKGROUND OF THE INVENTION (1) Field of the Invention

The invention relates to a television receiver of a type comprising a teletext decoding circuit and a storage means (page number memory) in which the page numbers associated with a plurality of teletext pages can be stored.

(2) Description of the Prior Art

Such a television receiver has several operating modes, more specifically a program-mode and a teletext mode. In the program mode the video signal transmitted by a transmitter is applied through a video channel to a picture screen for displaying the television program. In the teletext mode said video signal is applied through a teletext decoder circuit to the picture screen for displaying the teletext associated with the program. The television itself can be partly or wholly suppressed.

The operating mode is determined by the viewer, (user). To enable the viewer to inform the receiver about his wishes, the receiver includes a control system comprising external components which can be manipulated by the viewer. More specifically, this control system has a control panel with control keys, each having a specific control function. This function is indicated by a sign applied on, over or under the relevant control key. Thus, there are for example a volume control key, a luminance key, a teletext key, a mixed-mode key, a program key and a plurality fo figure keys etc. These last-mentioned keys are characterized in that the associated signs are numerals. If the receiver is in the program mode, the viewer can inform the receiver with the aid of the figure keys which program or channel is wanted. After the teletext or the mixed-mode key has been operated the set is in the teletext mode with a partly or wholly suppressed television program and the viewer keys-in the page number of the desired teletext page, using the same above mentioned keys.

Operation (or manupulating) of one or more of the keys on the control panel generally results in the generation of a control instruction by the control system. Such control instruction may include the page numbers of a desired teletext page. All these instructions are received by a control circuit which interprets these instructions and gives instructions to the different circuits to be controlled, including the teletext decoder circuit. More specifically, the teletext decoder receives a page number in response to which the required teletext page is captured, stored in a page memory and thereafther displayed on the picture screen by a character generator.

As is known a teletext index page is first displayed on the picture screen after a teletext key or the mixed-mode key has been operated. By selecting a desired page from this index and keying-in the associated page number with the aid of the numeric keys this teletext page is captured by the teletext decoder circuit and displayed thereafter.

If thereafter the display is required of a page associated with a different subject, the index page must usually again be consulted to find the page number of the relevant page. It should be borne in mind that each time the page number of a desired page is keyed-in it takes a certain period of time before the relevant page is displayed on the screen. It is therefore justified to state that such a television receiver is far from user-friendly. To improve this, it is proposed on page 527 of reference 1 to provide the receiver with a storage means which is coupled to the control circuit and in which a plurality of page numbers can be stored. This storage means will be referred to as the page number memory hereinafter.

By operating the control circuit, the user can store a first series of page numbers in a sequence in which he wants them to be displayed, in the page number memory. To enable the display in the desired sequence of these preselected teletext pages, the control panel has a key which will be called the read key hereinafter. Each time this key is operated, the control circuit receives an accurately defined operating instruction and a subsequent page number of the first series is read from the page number memory and applied to the teletext decoder circuit. In this way the teletext pages of the first series are sequentially displayed on the picture screen.

Thus, for this television receiver it is possible to select all those pages from an index page the viewer is interested in. The page corresponding numbers can be stored in the page number memory in the sequence in which the display of these pages is desired. Thereafter, they can be caused to appear in the desired sequence, one after the other, by pushing the read key once for every page.

It should be noted, that, after the read key has been operated, it also takes a certain time before the new page appears on the picture screen. However, by constructing the teletext decoder circuit in the way described in reference 1 or 2, a new page can be displayed immediately after pushing the read key. It is possible to couple to the teletext decoder circuit detailed in said reference a page memory having a capacity that no less than four pages can be stored therein simultaneously. All this is then organised such that this page memory contains the page actually displayed on the picture screen and also the three pages of the first series.

It should also be noted that the page number memory may be constituted by a non-volatile memory, so that the same series of teletext pages are permanently available. It is alternatively possible to use a volatile memory for this purpose, optionally in combination with a non-volatile page number memory.

SUMMARY OF THE INVENTION

The invention has for its object to further improve the convenience of use of a television receiver of the type defined in the foregoing, having a volatile page number memory. According to the invention, the control circuit performs the following additional steps:

interrupting the sequential display of the teletext pages of the series for the benefit of the sequential display of a number of further teletext pages which do not belong to the first series, whose associated page numbers are generated by means of the control system; and, continuing the display of the teletext pages of the first series in response to a further operation of the read key, after all the further teletext pages have been displayed on the screen.

The properties of the television receiver thus obtained will no doubt be appreciated when the following is considered. The contents of the first series of pages whose page numbers are stored in the page number memory are not known previously. When those pages are displayed, it may happen that a given page is itself an index page (denoted sub-index page in the sequel) or that it contains a reference to pages in which additional information on the same subject is contained. The viewer can now select from such sub-index page a further series of pages, generate the associated page numbers with the aid of the control system and insert the display of these pages between the sub-index page and the subsequent page of the first series. If the control circuit were not implemented in such a way that the above-defined steps can be performed, then these further pages could not be displayed until all the pages of this first series have been displayed on the picture screen.

REFERENCES

1. Enhanced UK teletext moves towards still pictures; J. P.Chambers: IEEE Transactions on Consumer Electronics, Vol. Ce-26, Aug. 1980, pages 527–532.
2. Computer controlled teletext; J. R.Kinghorn; Electronic Components and Applications, Vol. 6, No. 1, 1984, pages 15–29.
3. Bipolar IC's for video equipment; Philips Data Handbook Integrated Circuits Part 2, Jan. 1983.
4. IC's for digital systems in radio, audio and video equipment; Philips Data Handbook Integrated Circuits, Part 3, Sept. 1982.

DESCRIPTION OF THE PREFERRED EMBODIMENTS

General Structures of the Television Receiver

Figure 1:
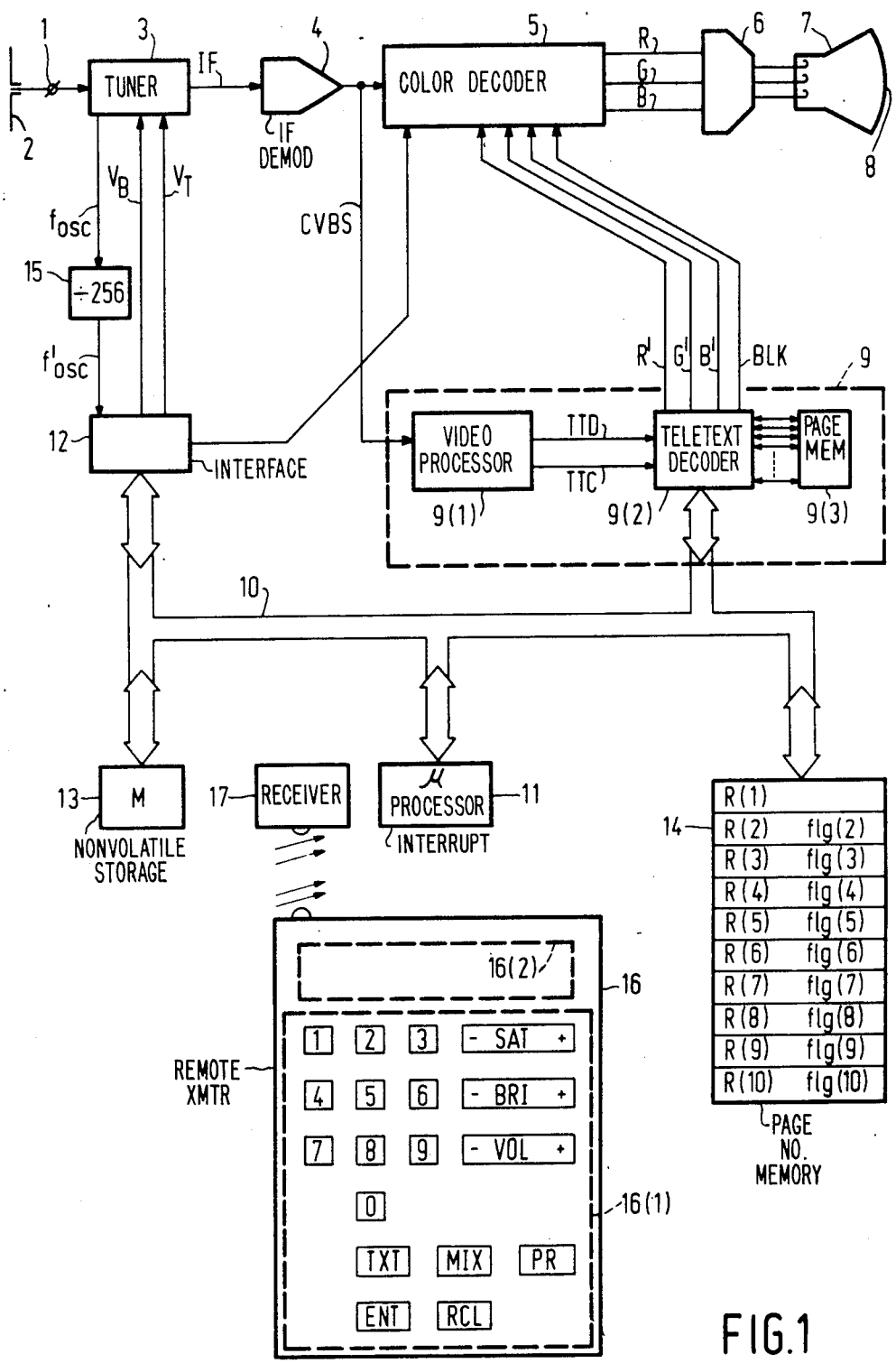
FIG. 1 shows the general structure of a television receiver comprising a teletext decoder circuit and FIGS. 2 to 10 shows diagrams to explain the operation of this television receiver.

FIG. 1 shows schematically the general structure of a colour television receiver. It has an antenna input 1 connected to an antenna 2, which receives a video signal modulated on a high-frequency carrier and processed in a plurality of processing circuits. More specifically, the video signal is applied to a tuning circuit 3 (tuner or channel selector) This tuning circuit receives a band selection voltage $V_B$ to enable tuning of the receiver to a frequency within one of the frequency bands VHF1, VHF2, UHF etc. In addition, the tuning circuit receives a tuning voltage $V_T$ for tuning the receiver to the desired frequency within the selected frequency band.

This tuning circuit 3 produces an oscillator signal having frequency $f_{OSC}$ and also an intermediate-frequency signal IF. The last-mentioned signal is applied to an intermediate-frequency amplifying and demodulating circuit 4 which produces a base band composite video signal CVBS. For this circuit 4 reference could be made to Philips IC TDA 2540, described in Reference 3.

The signal CVBS thus obtained is further applied to a colour decoder circuit 5, which produces the three primary colour signals R, G and B, which are applied by an amplifier circuit 6 to a picture tube 7 for displaying television programs on the picture screen 8. In the colour decoding circuit 5 colour saturation, contrast and luminance are influenced by means of control signals. In addition, the colour decoder circuit receives an additional set of primary colour signals R', G' and B', and also a switching signal BLK (Blanking) with which the primary colour signals R, G and B can be suppressed. For this circuit 5 a Philips integrated circuit of the group TDA 356 X, which is also described in Reference 3, can be used.

The video signal CVBS is also applied to a teletext decoder circuit 9, which comprises a video input processor 9 (1) receiving the video signal CVBS, separates the teletext data therefrom and applies the latter through a data line TTD to a circuit 9 (2) which will be called the computer controlled teletext decoder (abbreviated to CCT-decoder). This CCT-decoder also receives a clock signal from the video input processor 9 (1) through a clock line TTC. The decoder is further coupled to a memory 9 (3) in which one or more teletext pages can be stored and which is therefore called the page memory. This CCT-decoder produces the three previously-mentioned primary signals R', G', B' and also the switching signal BLK. The video input processor 9 (1) may be constituted by the Philips IC SAA 5230, the CCT-decoder 9 (2) by the Philips IC SAA 5240 and the page memory by a 1K8 to 8K8 RAM. For an detailed description of the structure and operation of a teletext decoder circuit reference is made, for the sake of brevity, to Reference 2.

The CCT-decoder 9 (2) is further connected to a bus system 10, to which also a control circuit 11, in the form of a microcomputer, an interface circuit 12, a non-volatile storage means 13 and a volatile storage means 14 are connected. The interface circuit 12 produces the band selection voltage $V_B$, the tuning voltage $V_T$ and also the control signals for controlling the analog functions contrast, luminance, colour saturation. It receives an oscillator signal having frequency $f'_{OSC}$ which by means of a frequency divider 15 whose dividing factor is 256, is derived from the oscillator signal having frequency $f_{OSC}$ supplied by the tuning circuit 3. Tuning circuit 3, frequency divider 15 and interface circuit 12 together form a frequency synthesizing circuit. The Philips IC SAB 3035, which is known by the name CITAC (Computer Interface for Tuning and Analog Control) and is described in Reference 4 may be used as the interface circuit.

The storage means is, for example, used to store the tuning data of a plurality of preselected transmitters, or programs. If under the control of the microcomputer 11 such a tuning datum is applied to the interface circuit 12, then it produces a given band selection voltage $V_B$ and given tuning voltage $V_T$, in response to which the receiver is tuned to the desired transmitter.

For the microcomputer the microcomputer of the Philips MAB 84XX family can be used. Although it may be assumed that the structure of a microcomputer is generally known, it should here be briefly remarked that it comprises a program memory (usually a ROM) in which the manufacturer stores a plurality of control programs, and also a working memory.

The volatile storage means 14 is used as a page number memory. It comprises a number of N page number-registers having the register numbers R(1), R(2), . . . R(p), . . . R(N), respectively, wherein N=10. This volatile storage means 14 which is shown in the drawing as a separate memory, is preferably constituted by a portion of the working memory of the microcomputer 11.

To operate this television receiver a control system is provided which in the embodiment shown is in the form of a remote control system and is constituted by a hand set 16 and a local receiver 17. This receiver 17 has an output which is connected to an input (usually the "interrupt"-input) of the microcomputer. The receiver may be the Philips IC TDB 2033 described in Reference 4 and then has for its object to receive infrared signals transmitted by the hand set 16.

The handset 16 comprises a control panel 16 (1) which, in addition to a number of numeric keys indicated by the numerals 0 to 9, has the following keys; a saturation key SAT, a brightness key BRI, a volume control key VOL, a teletext key TXT, a mixed-mode key MIX, a program key PR, a storage key ENT and a read key RCL. The keys of this control panel are coupled to a transmitter circuit 16 (2) for which the Philips IC SAA 3004 which is described in detail in Reference 4, may, for example, be used. If a key is depressed, then the transmitter circuit 16 (2) generates a code which is specific for that key and which transmitted on a infrared carrier to the local receiver 17, is demodulated there and thereafter applied to the microcomputer 11. Thus, the microcomputer receives control instructions and through the bus system 10 energizes one of the circuits coupled thereto. It should be noted that a control instruction may be single, that is to say that it is complete after only one single key has been operated. It may alternatively be a multiple instruction, that is to say that it is not complete until two or more keys have been operated. This situation occurs, for example, when the receiver is in the teletext mode. In that case operating the numeric keys does not produce a complete operating instruction until, for example, three numeric keys have been depressed. Such an operating instruction, consisting of for example three figures is called a page number.

Operation of the Television Receiver

Figure 2:

The operation of the television receiver shown in FIG. 1 is wholly determined by the various control programs stored in the internal program memory of the microcomputer. A control program which is always stored in such a receiver, is the switch-on program SWON which is symbolically shown in FIG. 2. Although this program is generally known, it should be noted for the sake of completeness that this program immediately applies a predetermined tuning datum present in the strorage means 13 to the circuit 12 after the receiver has been switched on, in response to which the receiver is tuned to the relevant transmitter. This may either be a predetermined transmitter, or it may be the transmitter the receiver was tuned to at the moment it was switched off.

Figure 3:
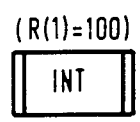
Figure 4:

After the switch-on program has been performed, the initiation program INT which is symbolically indicated in FIG. 3 is started. During this program the content of the first page number-register R (1) is made equal to a fixed page number; for example 100 (one hundred). This page number 100 is also applied to the CCT-decoder 9 (2) which decodes this page, stores it in the page memory 9 and displays it on the picture screen 8 after the teletext key TXT or the mixed-mode key MIX has been operated. To determine whether a key has been depressed, the so-called background program BGR, which is shown symbolically in FIG. 4 is started.

Figure 5:
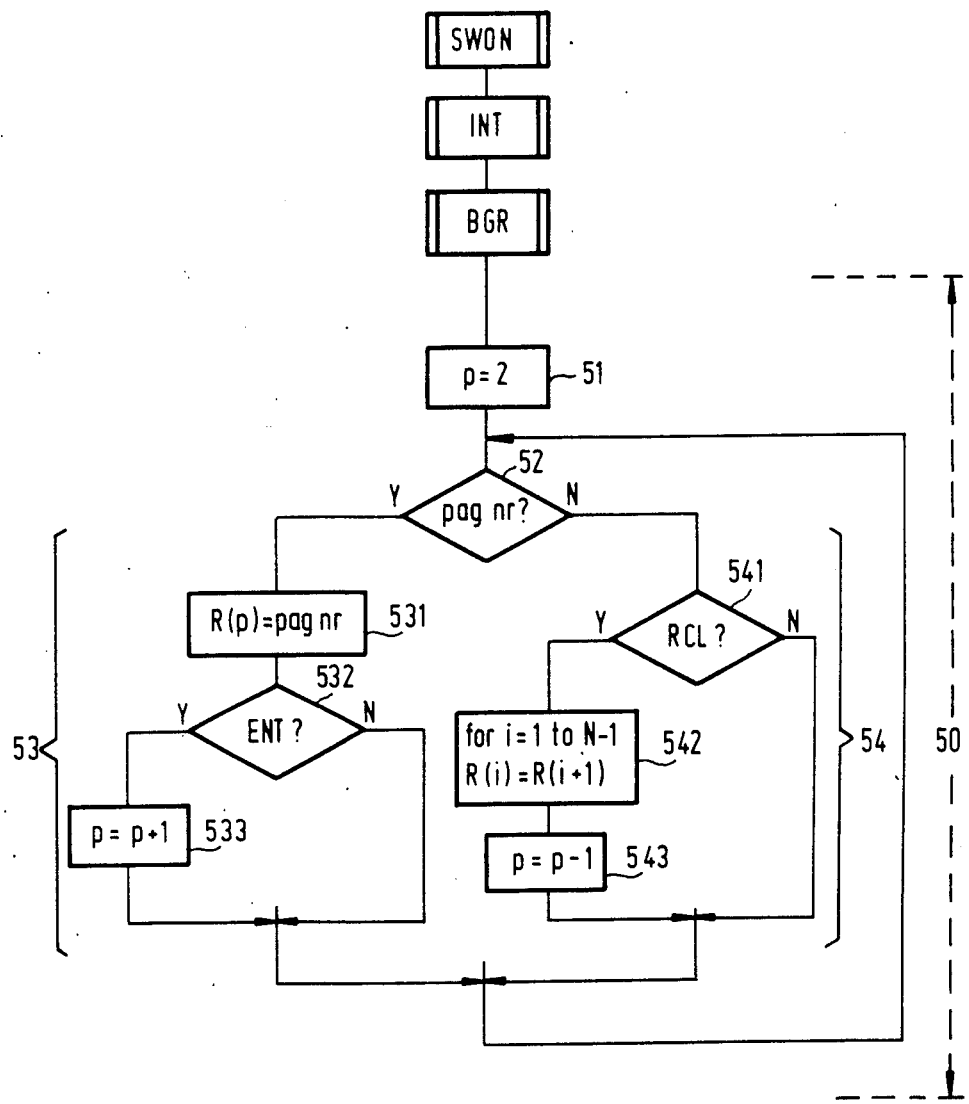

After the teletext key or the mixed-mode key has been operated a teletext program is started which is given the reference numeral 50 in FIG. 5. This program includes a step 51 in which the value 2 is assigned to a vector p. Thereafter, in a step 52 it is checked whether a page number is received. If so, then a storage program 53 is passed through or, if negative, a read program 54.

After such a program has ended, it is checked in step 53 whether a new page number is received.

Figure 6:
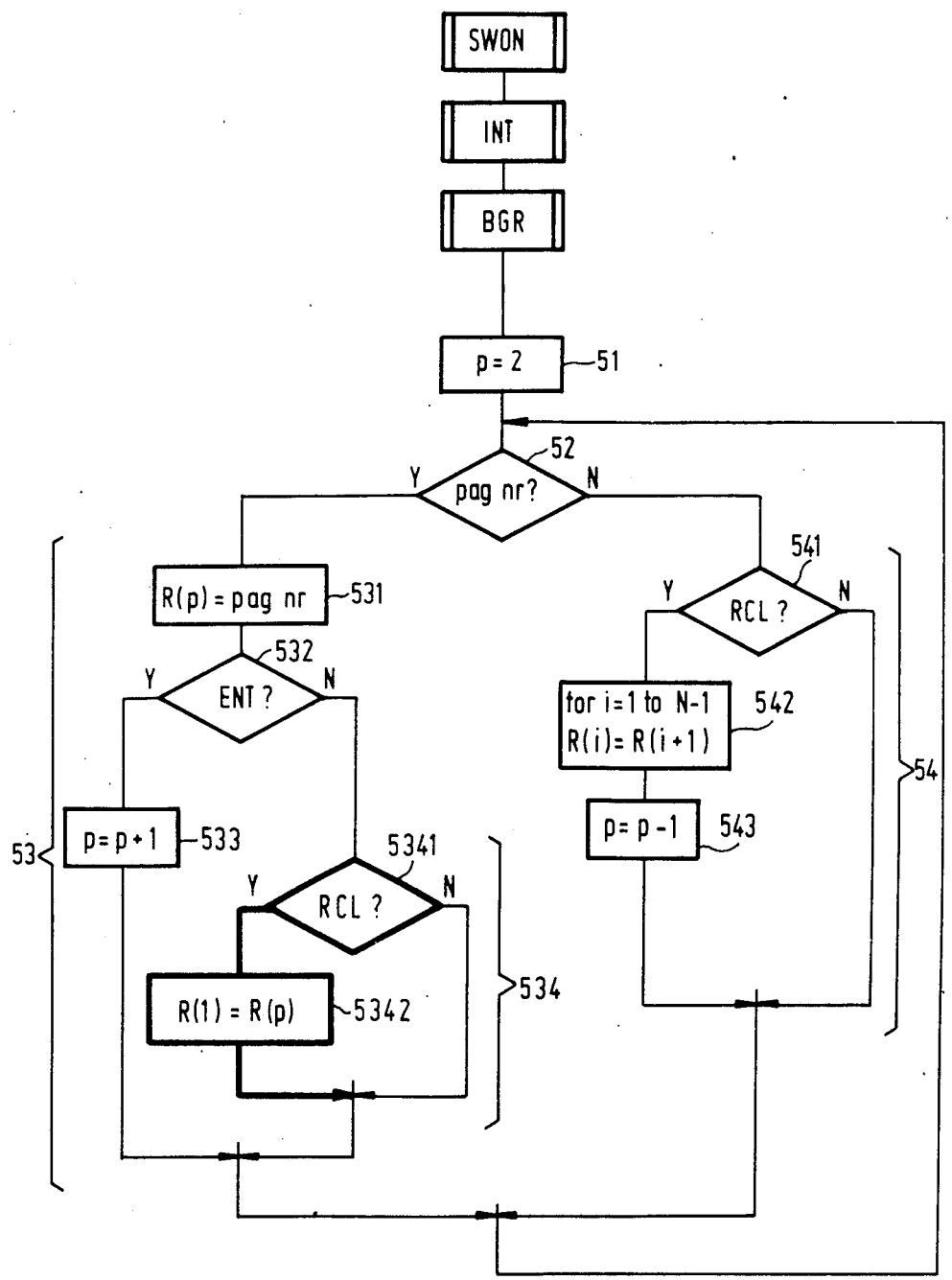

The storage program 53 includes a step 531 in which the page number received is stored in the register R(p). Thereafter, in a step 532 it is checked whether the storage key (enter key) ENT has been operated. If not, then this storage program has ended and the content of the register R(p) can be overwritten by a different page number. If the enter key has been operated, the vector p is first incremented by one in a step 533. Acting thus, the registers R(1) to R(N) can be loaded with page numbers of a first series of teletext pages. These pages can now be sequentially displayed on the picture screen by means of the read program and by operating the read key RCL. More specifically, the read program 54 has a step 541 in which it is checked whether the read key has been operated. If no, the read program has ended, if yes the contents of the registers are shifted in a step 542 to registers of the next lower number, that is to say the content of register R(2) is shifted to R(1), the content of register R(3) is shifted to R(2) etc. Thereafter the vector p is decremented by one unit in a step 543. So now vector p indicates the empty register having the lowest number. If now a new page number were received and the storage key ENT were depressed, then this new page number would be stored in the register R(p−1). Before the associated teletext page can be displayed, the read key RCL must then first be depressed p−2 times. Prestoring the page numbers of the desired teletext pages and the fact that only one key (namely the read key) must be operated to effect the display of these pages, makes this television receiver very user-friendly. However, the fact that a new page number cannot result in the immediate display of the associated page when not all the page number registers are empty (so that the vector p=1) is experienced as annoying. To increase the convenience and ease of use of this television receiver the storage program is provided, as is shown in FIG. 6, with an auxiliary read program 534 consisting of one step 5341 in which it is checked if after reception of a page number the read key RCL has been operated without the storage key ENT having been depressed. If this is indeed the case, then in a step 5342 the content of register R(p) is transferred to register R(1) and thus the relevant page is pulled-in and displayed as soon as the opportunity arises.

Figure 7:
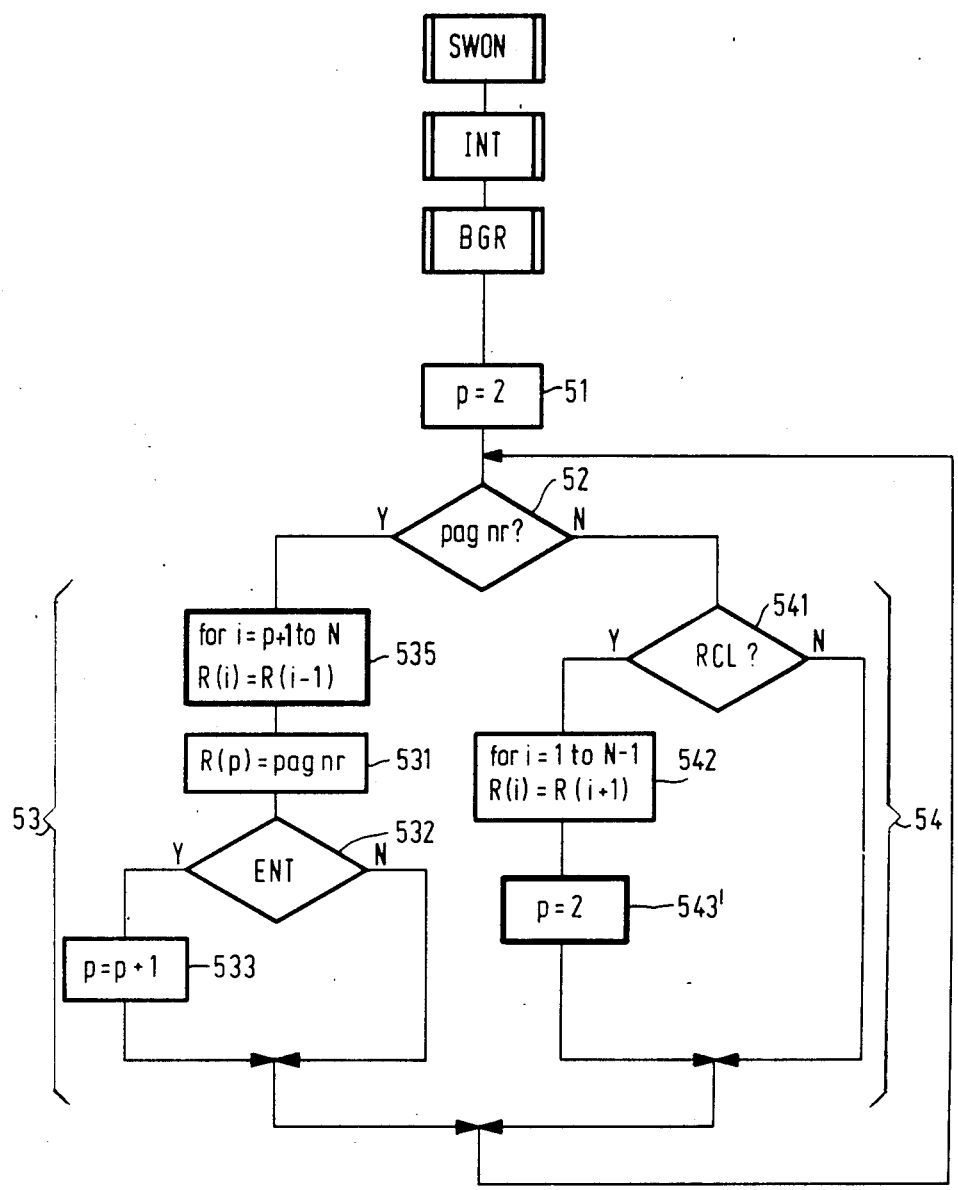

With the program shown in FIG. 6 a subsequent, new page number can be applied after the preceding new page number has been transferred from register R(p) to register R(1). A storage and read program with which the successive display of the teletext pages of the first series can be interrupted to enable the storage of a second series of pages in a sequence the user wants them to be displayed and the sequential display of the pages of this second series in response to the pushing of the read key RCL, followed by the display of the original (first) series of pages, is illustrated in FIG. 7. This program differs from the program shown in FIG. 5 in that now the read program 54, has, instead of the program step 543 a program step 543' in which the vector p is made equal to two after each operation of the read key RCL and the register contents have been shifted one register in step 542, this vector becomes equal to two.

The storage program 53 further comprises a step 535 in which the contents of the register R(p) to R(N−1) are shifted to registers of a next higher number.

If, after the read key RCL has been depressed and the read program has been performed a new page number is applied to the microcomputer, then in step 535 the content of the second register R(2) is shifted to the third register R(3), the content of the third register R(3) is shifted to the fourth register R(4) etc. Thereafter the new page number is stored in the second register R(2) in step 531. If thereafter the storage key ENT is operated, then the vector becomes equal to 3. A new page number is then stored in the third register R(3), whilst the original content of the third, fourth, fifth, sixth etc. registers are shifted to the fourth, fifth, sixth, seventh etc. registers, respectively. So acting thus a second series of Q−1 page numbers can be stored in the registers R(2) to R(Q) each time the read key RCL is operated, the page numbers originally contained in these registers being shifted to registers of Q−1 higher numbers. When the read key is now operated, these Q−1 page numbers of the second series are first applied to the teletext decoding circuit and only thereafter the display of the original (first) series is continued.

Figure 8:
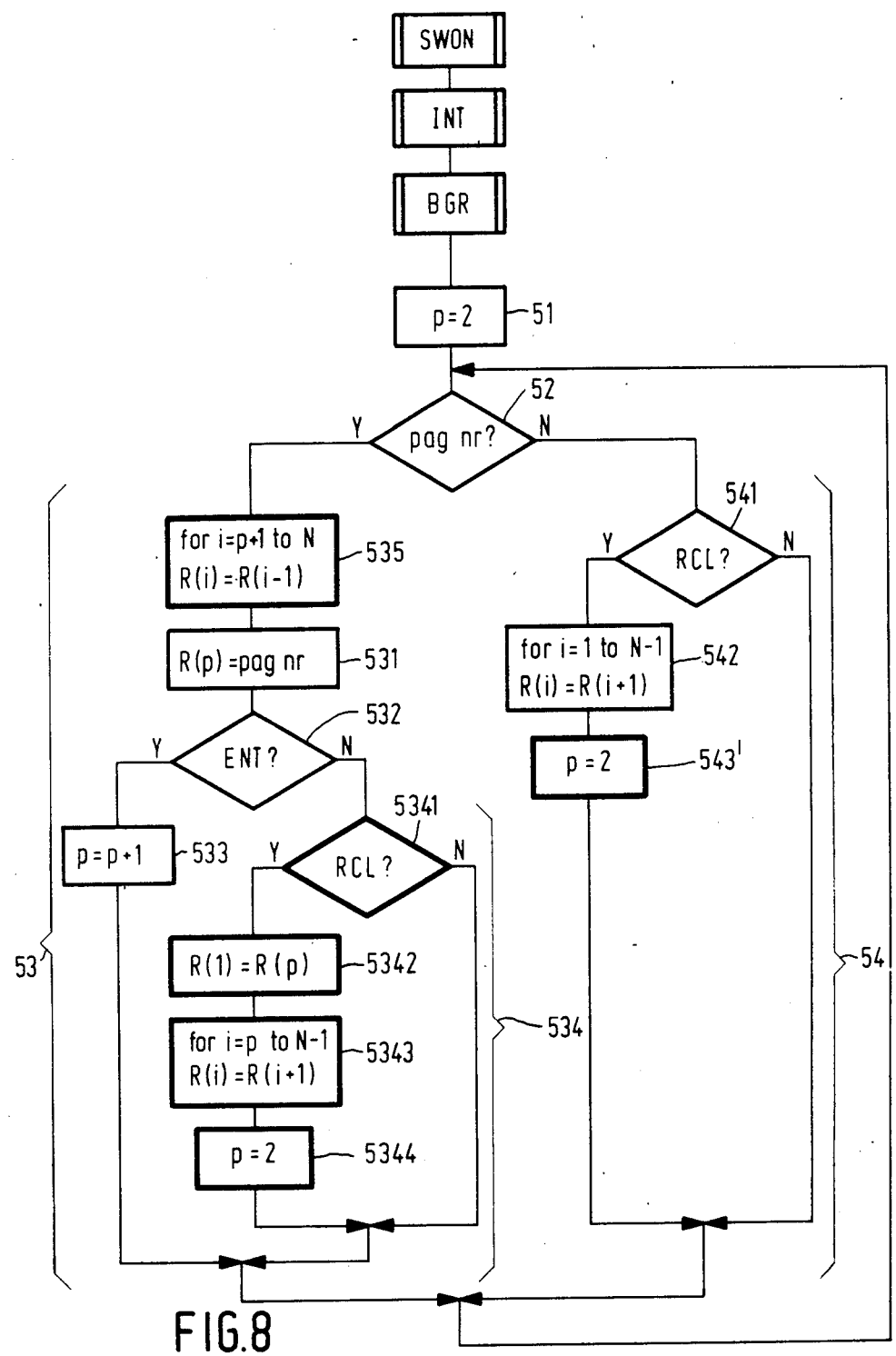

The program shown in FIG. 6, which provides the possibility of storing a new page number directly in the first register, and thus to display the associated page on the display screen at the first opportunity can advantageously be combined with the program shown in FIG. 7. For the sake of completeness, FIG. 8 shows a program comprising both the program steps shown in FIG. 6 and those shown in FIG. 7. To have this program proceed adequately, the steps 5343, 5344 are additionally present which, in view of the foregoing need no further explanation.

Figure 9:
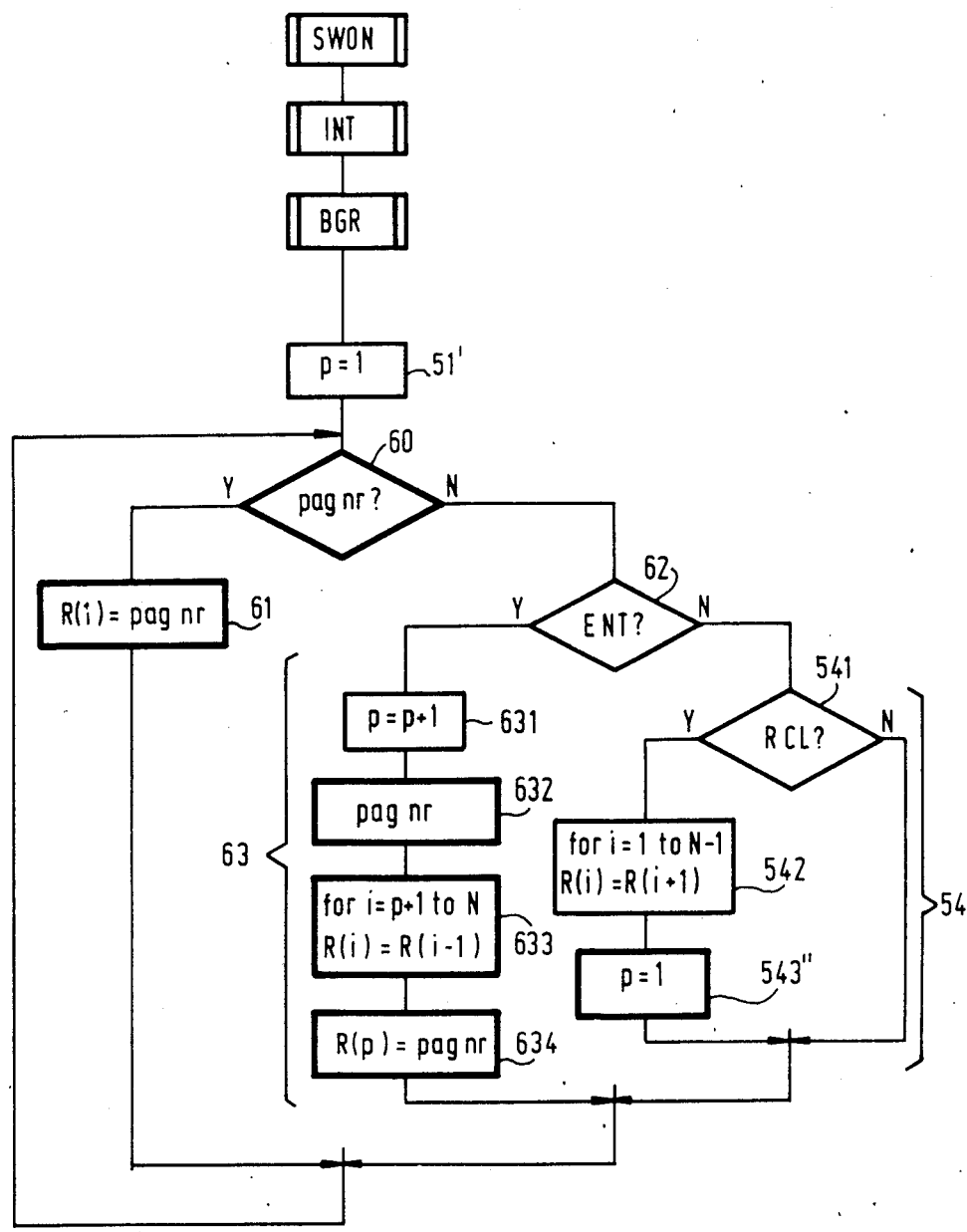

The teletext programs shown in FIGS. 5, 6, 7 and 8 are structured such that storing a series of new page numbers requires the operation of the storage key ENT after a new page number has been applied. It is however, alternatively possible to structure the teletext program such that the storage key must be operated before a new page number is applied. Such a teletext program is shown for the sake of completeness in FIG. 9. It comprises a step 51' in which the vector p is given the value one. To enable, a decision which the program shown in FIG. 6, also now the immediate storage of any random page number in the register R (1), this program has a step 60 in which it is checked whether a page number is applied. If yes, this page number is immediately stored in the first register R(1) in step 61, whereafter early display of the relevant page can follow. If no page number is coming forward, then it is checked in step 62 whether the storage key ENT has been operated. If not, the read program 54 is effected or else the storage program 63.

The read program again includes the steps 541 and 542. It now also has a step 543" in which the vector p is again made equal to one. The storage program 63 has a step 631 in which the actual value of the vector is incremented by one. Thereafter, in a step 632, the arrival of a new page number is awaited, whereafter in step 633 the contents of the registers R(p) to R(N−1), respectively are shifted to the registers R(p+1) to R(N). Finally, in step 634 the latest page number is stored in the register R(p).

Figure 10:
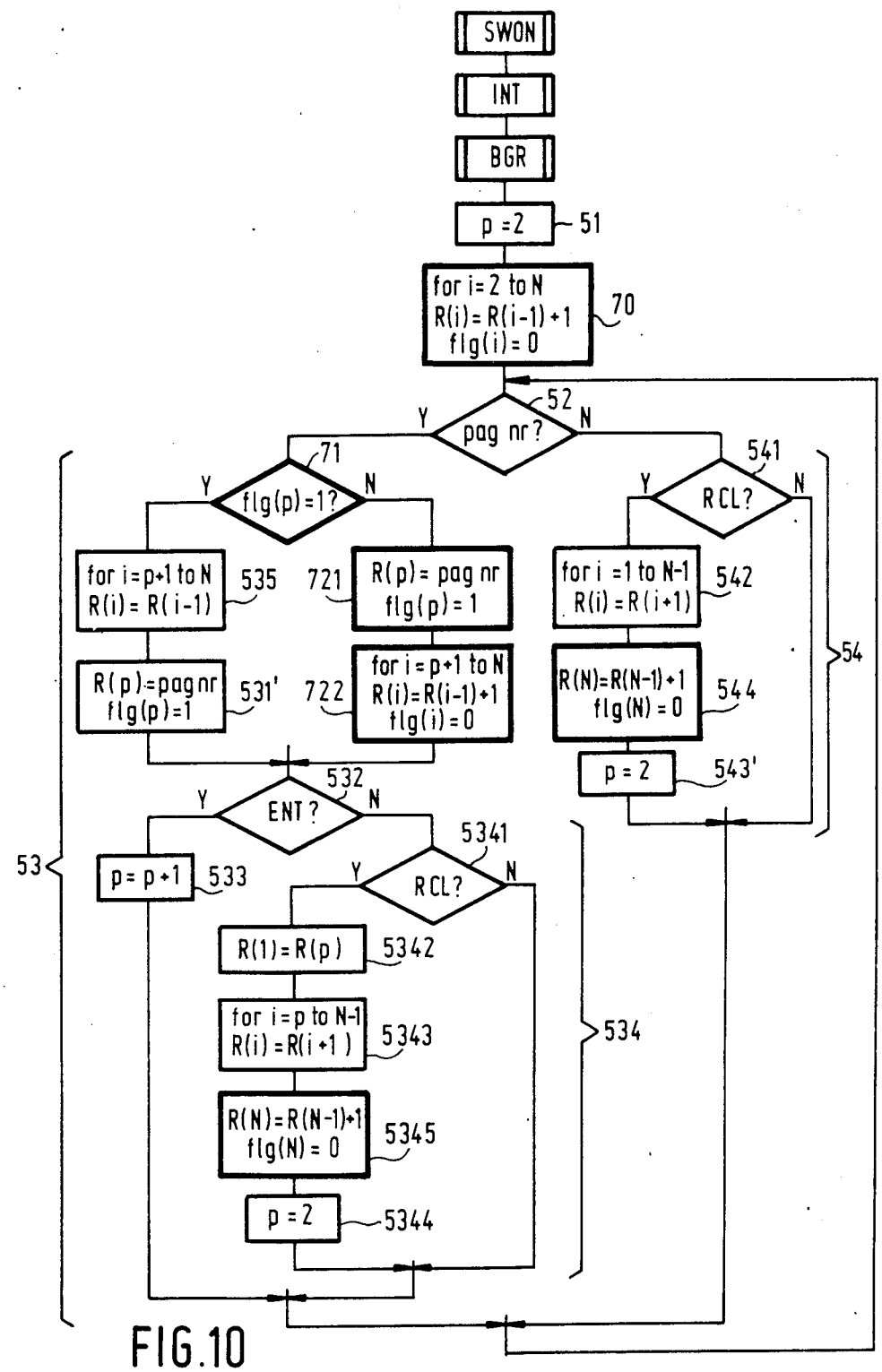

The teletext programs mentioned in the following have the property that those page number registers R(.) in which no page numbers selected by the user are stored remain empty. This implies that when the user repeatedly depresses the read key he may be confronted by the situation that all registers are empty. To prevent this situation from occurring, these registers may be filled automatically with page numbers for which there are two adequate possibilities. Firstly, they might be the page numbers of preferred pages which had previously been stored already by the user in a non-volatile memory, for example, the memory 13 in FIG. 1. Secondly, they might be the page numbers S+1, S+2, . . . etc., S being the last page number of the first series. To accomplish that the page number registers are filled thus with page numbers, the teletext program might be of a structure as shown in FIG. 10. This program corresponds to a considerable extent to the program shown in FIG. 8, but differs therefrom in several respects. Step 52 is followed by a step 70 in which a page number and also a user flag flg.(−) are stored in the registers R(2) to R(N) (see FIG. 1). More specifically, the page number in the register R(i) then becomes one higher than the page number in the preceding register R(i−1), so that at the end of this step 70 the page number registers R(1) to R(n) contain the respective page numbers 100, 101, 102, 103, . . . 100+(N−1). The associated user flags are all zero.

If at a given value of the vector p a new pagenumber, for example S, is applied, then in step 71 it is first checked whether the user flag (flg(p) in the register R(p) is equal to one. If not this implies that the register R(p) is not filled with a page number explicitly stipulated by the user. In step 721 this newly applied page number S is then stored in this register R(p). At the same time the associated user flag flg (p) becomes 1 to indicate that this page number has been selected by the user. Thereafter a step 722 is performed which corresponds to step 70. More specifically, the page number S+1 is then stored in the register R(p+1), the page number S+2 in the register R(p+2) whilst the associated user flags flg(p+11), flg(p+2), etc. all become equal to zero, signifying that these page numbers were not explicitly stated by the user.

If upon performing of step 71 it appears that the user flag flg(p) in the register R(p) is indeed equal to one, then in step 535 the contents of the registers R(p) to R(N−1) are shifted to the respective register R(p+1) to R(N), so that in step 531' the latest page number can be stored in the register R(p), the associated user flag flg(p) then simultaneously becoming equal to one.

This teletext program further differs from the program shown in FIG. 8 in that the auxiliary read program 534 has a further step 5345 and the read program 54 has a further step 544 identical thereto. In these steps, each time after the last page number register R(n) has become empty because of the shift operation effected in the preceding step, a page number which is one higher than the page number stored in the last-but-one register R(N−1) is stored in this register R(N). At the same time the associated user flag flg (N) becomes equal to zero.

It should be noted that in the embodiment shown in FIG. 1 the control circuit is predominantly constituted by the microcomputer 11. In practice it has however been found advantageous to arrange between the microcomputer 11 and the CCT-decoder 9(2) a second micro computer which only controls this CCT-decoder 9(2) and for that purpose comprises one of the teletext programs described in the foregoing.

What is claimed is:
1. A television receiver comprising:
    a control system for generating in response to external manipulations control instructions including teletext page numbers of teletext pages to be displayed on said television receiver;

a teletext-decoder circuit having a page number input for receiving from said control system page numbers of teletext pages to be displayed and having a picture output applying the picture signal of the teletext page to be displayed;

a picture screen coupled to display the picture signal from the picture signal output of the teletext decoder circuit, said picture screen displaying a teletext page which is identified by an associated page number;

page number storage means for storing a plurality of page number; and a programmable control circuit coupled to the page number storage means and to the control system for receiving the control instructions, and to said page number input of the teletext decoder circuit to apply teletext page numbers thereto, the control circuit being programmed for carrying out the steps of:

storing in the page number storage means a first series of preselected teletext page numbers selected by a user in the order in which the corresponding teletext pages are desired for display;

successively applying the teletext page numbers of said first series to the teletext-decoder in response to successive occurrences of a selected first control instruction for successively displaying the teletext pages corresponding to the teletext page numbers successively applied to the teletext-decoder;

interrupting the successive application of teletext page numbers of said first series to the teletext-decoder in response to the occurrence of a selected further control instruction;

storing intermediate teletext page numbers in the order in which the corresponding teletext pages are desired for display;

successively applying the intermediate teletext page number to the teletext-decoder in response to successive further occurrences of the selected control instruction; and continuing the successive application of the remainder teletext page numbers of said first series to the teletext decoder after all the intermediate teletext page numbers have been applied thereto.

2. A television receiver as claimed in claim 1, in which the storage means comprises N registers, each register storing a teletext page number, whereby registers storing teletext page numbers selected by the user are defined to be occupied registers and whereby the remaining registers are defined to be non-occupied registers, the control circuit is further programmed for:

making a register non-occupied in response to each occurrence of the selected first control instruction, generating a sequence of further page numbers $S+1$, $S+2$, $S+3$, ... in which S represents the last teletext page number of the first sequence; and storing the teletext page numbers $S+1$, $S+2$, ... $S+(N-M)$ in the respective non-occupied registers, where M is the actual number of occupied register.

* * * * *